United States Patent
Morrish et al.

(10) Patent No.: US 6,426,668 B1
(45) Date of Patent: Jul. 30, 2002

(54) IMBALANCED SENSE AMPLIFIER FUSE DETECTION CIRCUIT

(75) Inventors: J. R. Morrish, Shelburne; John T. Phan, Williston, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/814,574

(22) Filed: Mar. 22, 2001

(51) Int. Cl.[7] .......................... H01H 37/76; H01H 85/00
(52) U.S. Cl. ......................................................... 327/525
(58) Field of Search ........................... 327/51, 55, 56, 327/57, 215, 219, 525, 562

(56) References Cited

U.S. PATENT DOCUMENTS

| | | | |
|---|---|---|---|
| 5,514,980 A | 5/1996 | Pilling et al. | 326/38 |
| 5,801,574 A | 9/1998 | Martin et al. | 327/525 |
| 5,812,477 A | 9/1998 | Casper et al. | 365/225.7 |
| 6,016,264 A | 1/2000 | Lin | 365/96 |
| 6,021,067 A | 2/2000 | Ha | 365/185.21 |
| 6,084,814 A | 7/2000 | Casper et al. | 365/225.7 |
| 6,108,260 A | 8/2000 | Casper | 365/225.7 |
| 6,150,868 A * | 11/2000 | Kim et al. | 327/525 |
| 6,201,432 B1 * | 3/2001 | Lim et al. | 327/525 |
| 6,215,351 B1 * | 4/2001 | Le et al. | 327/525 |
| 6,259,309 B1 * | 7/2001 | Mueller et al. | 327/526 |
| 6,281,739 B1 * | 8/2001 | Matsui | 327/525 |
| 6,288,598 B1 * | 9/2001 | Huang et al. | 327/525 |

OTHER PUBLICATIONS

IBM Technical Disclosure Bulletin, "DC CMOS Fuse True/Complement Generator", vol. 30, No. 12, May 1988, p. 51.

* cited by examiner

Primary Examiner—My-Trang Nu Ton
(74) Attorney, Agent, or Firm—McGinn & Gibb, PLLC; Howard J. Walter, Jr.

(57) ABSTRACT

A method and structure to provide a circuit adapted to sense the status of a fuse includes an imbalanced sense amplifier latch which includes first and second nodes connected to the fuse. The first node is connected to a fuse and is weaker than the second node, allowing the first node to sense a different voltage level. The voltage difference between the nodes indicates the conductive status of the fuse.

17 Claims, 5 Drawing Sheets

IMBALANCED SENSE AMPLIFIER FUSE DETECTION CIRCUIT

BACKGROUND OF THE INVENTION

1. Field of the Invention

The present invention generally relates to fuses within integrated circuit devices and more particularly to an imbalanced sense amplifier circuit that detects high resistance programmed fuses.

2. Description of the Related Art

Fuses are used in semiconductor manufacturing processes for a number of reasons and are primarily utilized to protect or selectively connect/disconnect devices within the integrated circuit. Fuses can be used to change the logic of the integrated circuit by making or breaking connections between logic devices. Similarly, fuses can be utilized to disconnect defective devices from the remaining properly operating devices. As is well known to those ordinarily skilled in the art, fuses within semiconductor devices have a number of other functions.

There are two broad types of fuses, the first being a fuse and the second being an antifuse. A traditional fuse forms an electrical connection until it is opened (e.g., programmed, blown, etc.). To the contrary, an antifuse naturally resides in a disconnected state and only forms an electrical connection when it is closed (e.g., programmed, blown, etc.).

When an antifuse is blown, an insulator between two conductors is destroyed and the conductive portions within the fuse join to form an electrical connection. However, sometimes the electrical connection that is made still retains a large portion of the insulator material and has a high resistance. The intent in programming the antifuse is to form a low resistance electrical connection; however, if the blown antifuse has a high resistance, the integrated circuit may operate as if the antifuse had never been closed. Similarly, conventional poly electrical-fuses have a very low resistance (poly efuses) before programming. When the poly efuse is programmed (blown), the 'open' fuse resistance can be marginal (e.g., remain low), which presents a problem similar to a blown antifuse. The invention discussed below solves these problems using a novel circuit design.

SUMMARY OF THE INVENTION

It is, therefore, an object of the present invention to provide a circuit adapted to sense the status of a fuse. An imbalanced sense amplifier latch which includes first and second portions connected to the fuse. The first portion of the latch is connected to a fuse and is weaker than the second portion, allowing the first portion to sense a lower voltage. The voltage difference between the portions indicates the conductive status of the fuse.

The first portion includes devices having a gate size smaller than that of the devices in the second portion. The invention also includes a first transistor between the fuse and the imbalanced sense amplifier latch and a second transistor between the imbalanced sense amplifier and ground. The delay between activation of the transistors controls a sensing resistance threshold of the circuit. Several precharge devices are connected to the imbalanced sense amplifier latch. More current flows through the first than the second in an antifuse application.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The disclosed circuit solves the problem, discussed above, with antifuses which have high resistance after being programmed and regular fuses that have low resistance after being programmed. The inventive circuit discussed below accurately detects a high resistance as a short state, works reliably with a fluctuating power supply, has a controllable resistance detection range, and has a small layout area.

Figure 1:
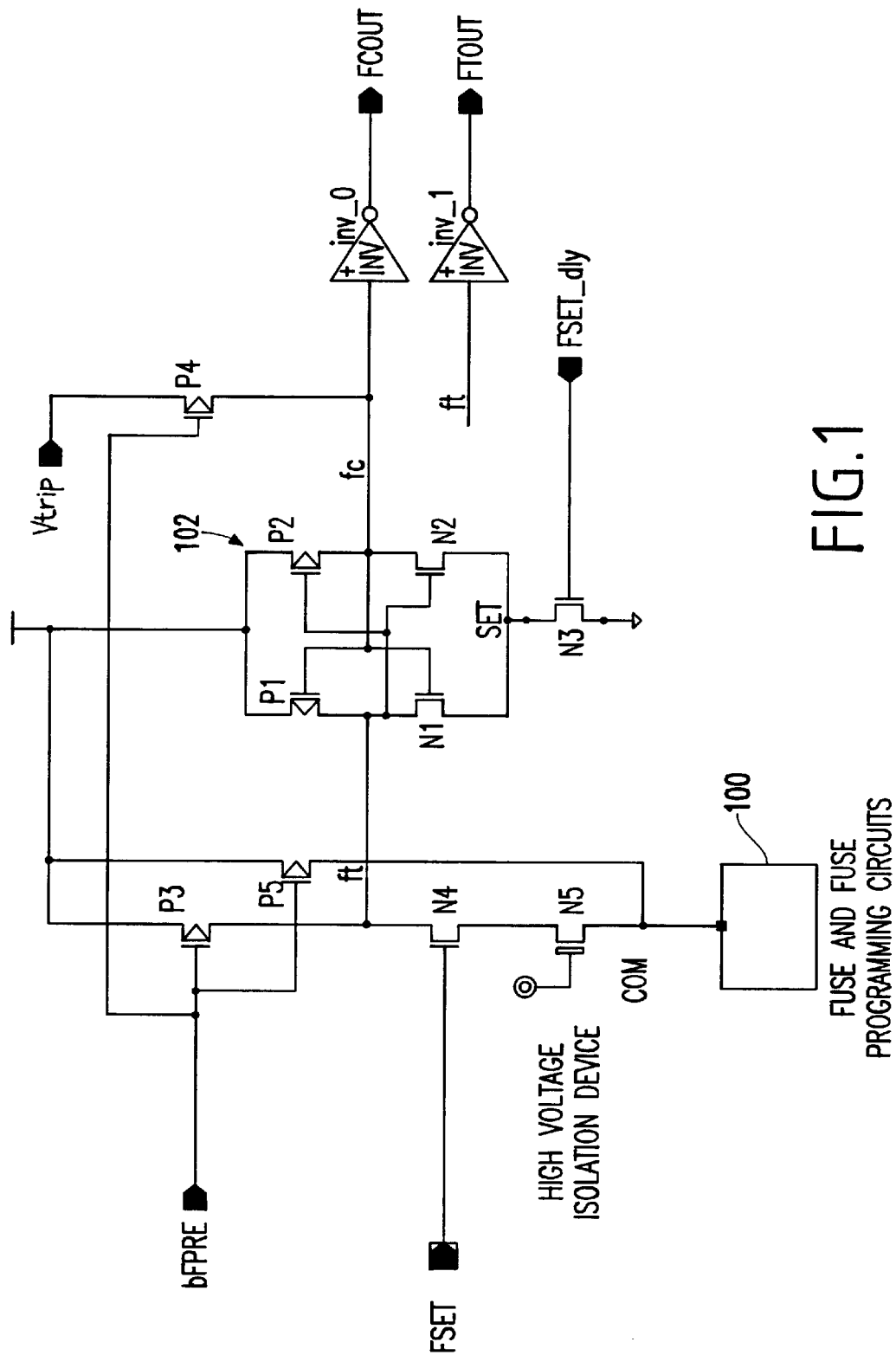
FIG. 1 is a schematic circuit diagram of a first embodiment of the invention.

FIG. 1 illustrates a first embodiment of the inventive detect circuit with a fuse device 100, which in this example is an antifuse. However, as would be known by one ordinarily skilled in the art given this disclosure, the fuse device 100 can be a laser fuse, poly electrical-fuse (poly efuse), anti gate oxide fuse (antifuse), etc.

The inventive circuit includes precharge devices P3, P4, P5, an imbalanced sense amplifier latch 102 (N1, N2, N3, P1, P2) and a set device N4 connected to the fuse 100. All transistors preferably have the same minimum width. The sense amplifier latch 102 is a specific design with channel length L(N1)>L(N2) and L(P2)>L(P1) to make N1 a weaker device than N2 and P2 a weaker device than P1 respectively, thus the name imbalanced sense amplifier latch.

Figure 2:
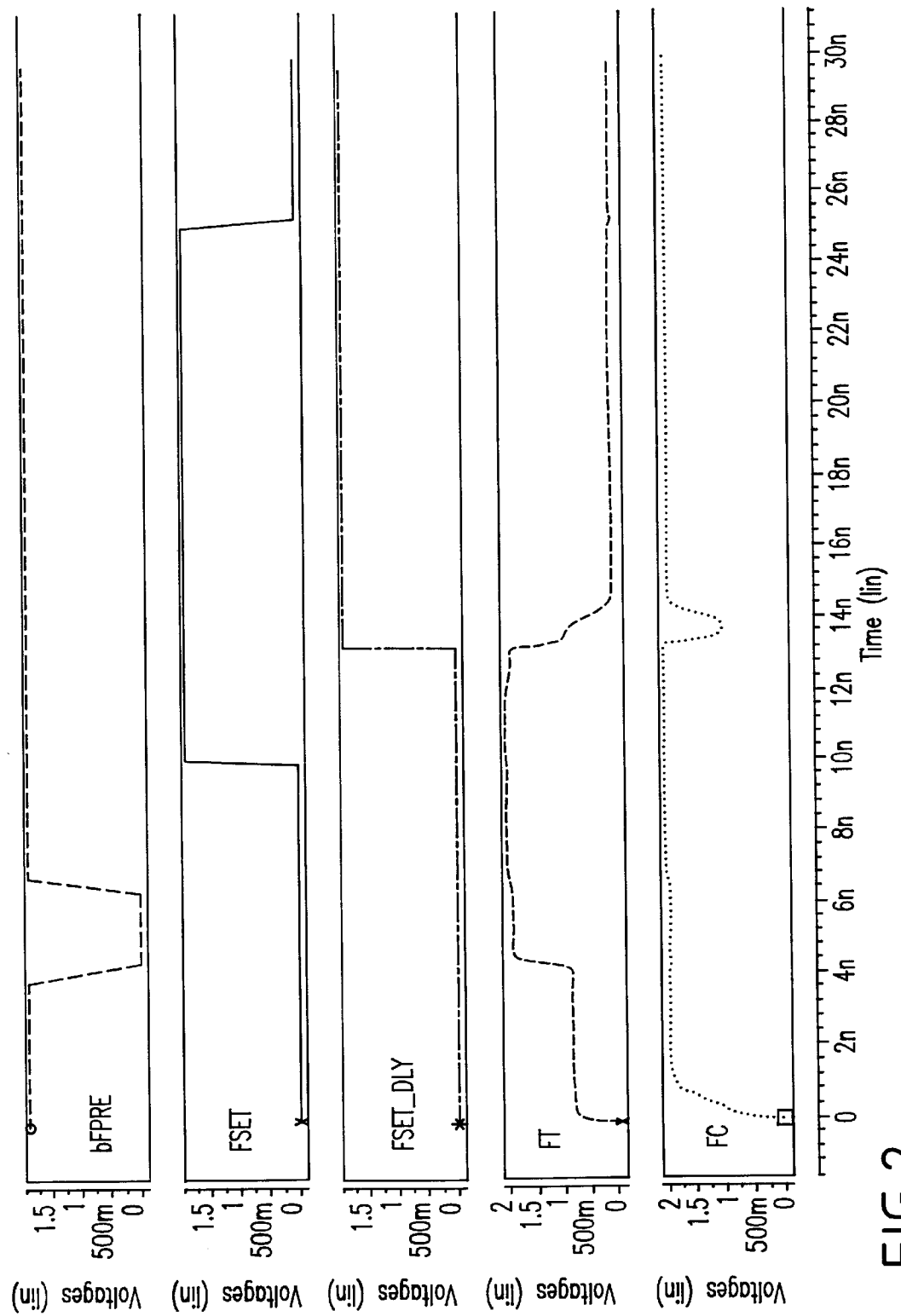
FIG. 2 is a timing diagram illustrating the operation of the circuit shown in FIG. 1.

As shown in FIGS. 1 and 2, during power-up, the signal bFPRE pulses low, transistors P3, P4 and P5 turn on which brings both nodes FT, FC, and COM to the same VDD voltage level. Then FSET pulse high to turn on N4 transistor.

If the antifuse 100 is blown (e.g. has a conductive short state) there is a conduction path from node FT to ground causing a voltage drop at node FT. If the differential voltage between FT and FC is 150 mv or more, the sense amplifier latch will set FT to ground when the set device N3 turns on with FSETdly. FSETdly is a controllable time delay between N4 on to N3 on. Therefore, even if a high resistance programmed antifuse can produce a voltage as small as 150 mv, the inventive circuit will recognize the fuse as being closed and will process the signals through that blown antifuse as though it were a low resistance closed antifuse.

The sense amplifier latch can detect a wide resistance range by controlling FSETdly delay and sizing N3 device.

Figure 3:
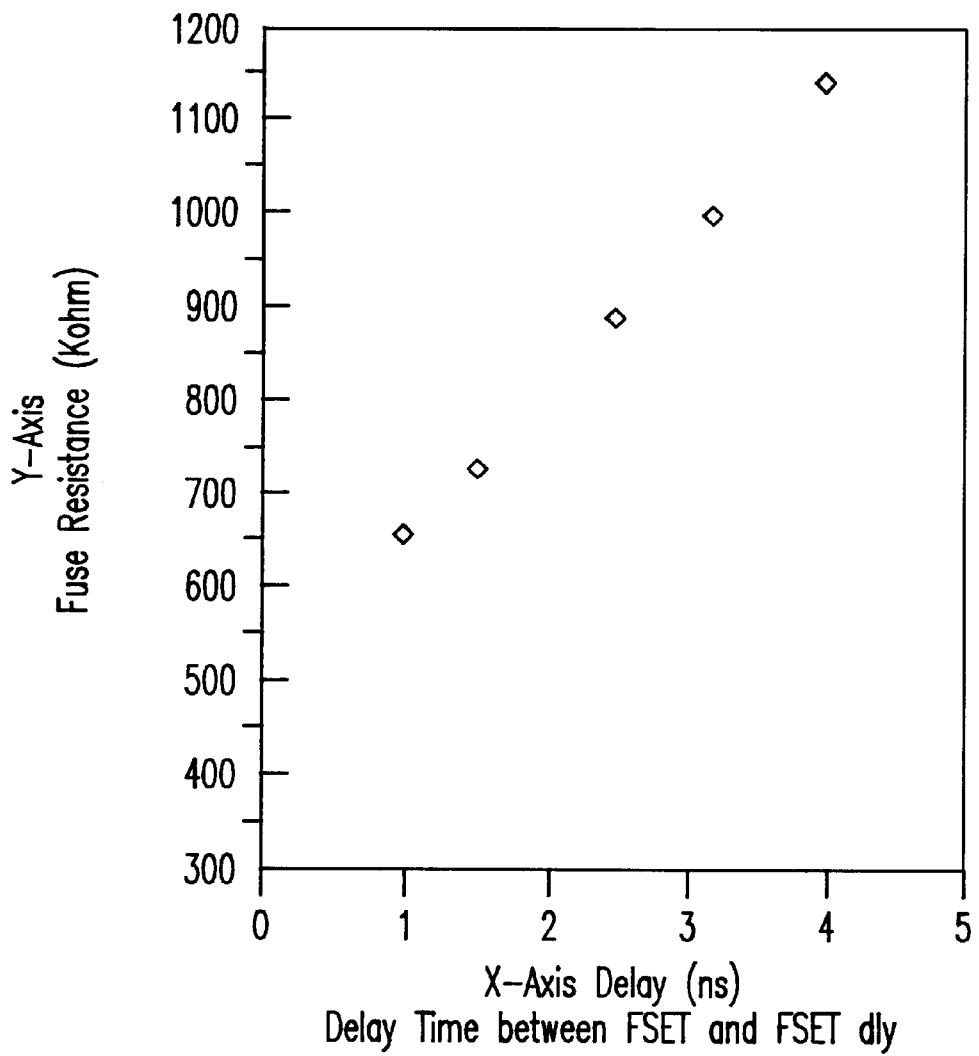
FIG. 3 is a graphic representation of the performance of the inventive circuit showing fuse resistance compared to delay.

FIG. 3 shows the relationship between fuse resistance and delay time. When FSET goes high, node FT, which has been precharged to Vdd (with bFPRE), begins to discharge through N4 and N5 and finally through the programmed antifuse. At the same time, the node FC does not have a discharge path and remains at the precharge level of Vdd. The consequent growing voltage differential between FT and FC is called signal development. The time from FSET active (N4 turn on) to FSETdly active (N3 turn on) is defined as the delay time of signal development. The longer this delay time, the more time for FT node to discharge toward ground and therefore the higher the fuse resistance that the latch can detect.

The N3 device size controls the discharge rate of node SET. The bigger the N3 device size, the faster the discharge of node SET and vice versa. For a programmed antifuse, as node SET discharges (FSETdly active), device N1 will turn on first, and provide an additional path for discharge of node FT. If node FT and node SET continue discharging together at a similar pace, then device N2 actually never turns on and node FT will fully discharge to ground while node FC remains at Vdd. On the other hand, if node SET discharges rapidly (faster than node FT), then device N2 can also turn on allowing node FC to discharge, compromising the accuracy of the latch. This unwanted condition is often referred to as 'off-side conduction'. If off-side conduction occurs then the size of device N3 should be reduced to allow node SET to discharge at a slower rate and prevent the off-side conduction.

If the antifuse 100 is not blown (open state) nodes FT and FC remain at the same voltage level after FSET turns transistor N4 on. When FSETdly asserts, there is a current path from both FT and FC to ground. Since N1 is a weaker device, more current flows through N2 causing a greater voltage drop on node FC than node FT. When FC falls below a VT for device P1, node FT is pulled back to Vdd, eventually causing the latch to set with FT high and FC low. Therefore, so long as the insulator resistance in the antifuse allows no significant discharge of node FT, the inventive circuit will recognize that the antifuse has not been programmed.

FIG. 2 is a timing diagram of the circuit in FIG. 1. VTRIP on the source of device P4 is connected to Vdd and the programmed fuse resistance is 1 Mohm. Initially, bFPRE is set to Vdd, FSET and FSETdly are at ground. When bFPRE pulses low at time 4 ns, FT, FC and COM nodes are precharged to Vdd. At the time 10 ns FSET pulses high, N4 turns on and there is a current path from FT to ground. The delay time between FSET and FSETdly is set to 3 ns in this example. During this signal development time, FT node voltage will discharge toward ground. When FSETdly is activated at time 13 ns, the latch sets with FT low and FC high, indicating a blown (conductive) antifuse.

FIG. 3 shows the relationship between fuse resistance and delay time between FSET and FSETdly. If both FSET and FSETdly are activated simultaneously (e.g., 0 ns delay) the maximum detectable fuse resistance is 550 Kohm. If the delay is 3 ns the latch can detect up to 1 Mohm. The graph is linear which means that the invention can precisely control the fuse resistance that the latch can detect as a blown fuse. Therefore, the invention is scalable to accommodate any desired resistance value to detect a blown fuse.

While the foregoing emphasizes the antifuse, other fuses can also be used. The latch in FIG. 1 can also be used with conventional fuses by replacing antifuse 100 with conventional fuse 100B or by adding a parallel conventional fuse 100B as in FIG. 4. The latch provides both outputs (FCOUT and FTOUT) so one can use the appropriate output depending on the fuse type.

Figure 4:
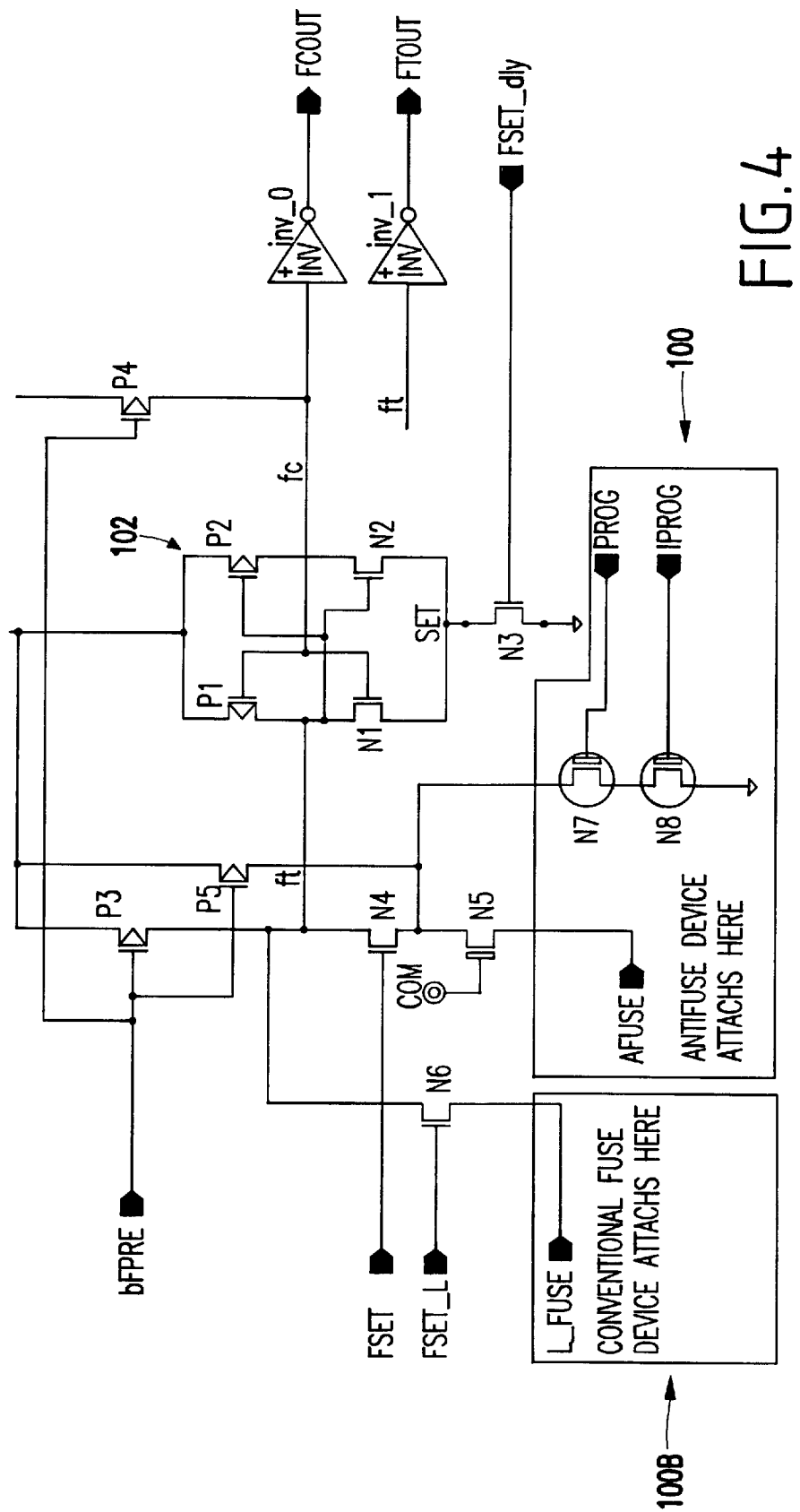
FIG. 4 is a schematic circuit diagram of a second embodiment of the invention.

FIG. 4 shows a fuse latch with antifuse 100 and conventional fuse 100B. It can be electrically configured for either fuse type. If an antifuse 100 is used, FSET and device N4 are invoked. If the conventional fuse 100B is used, FSET_L and device N6 are invoked. In FIG. 4, N7 and N8 are fuse programming devices.

Figure 5:
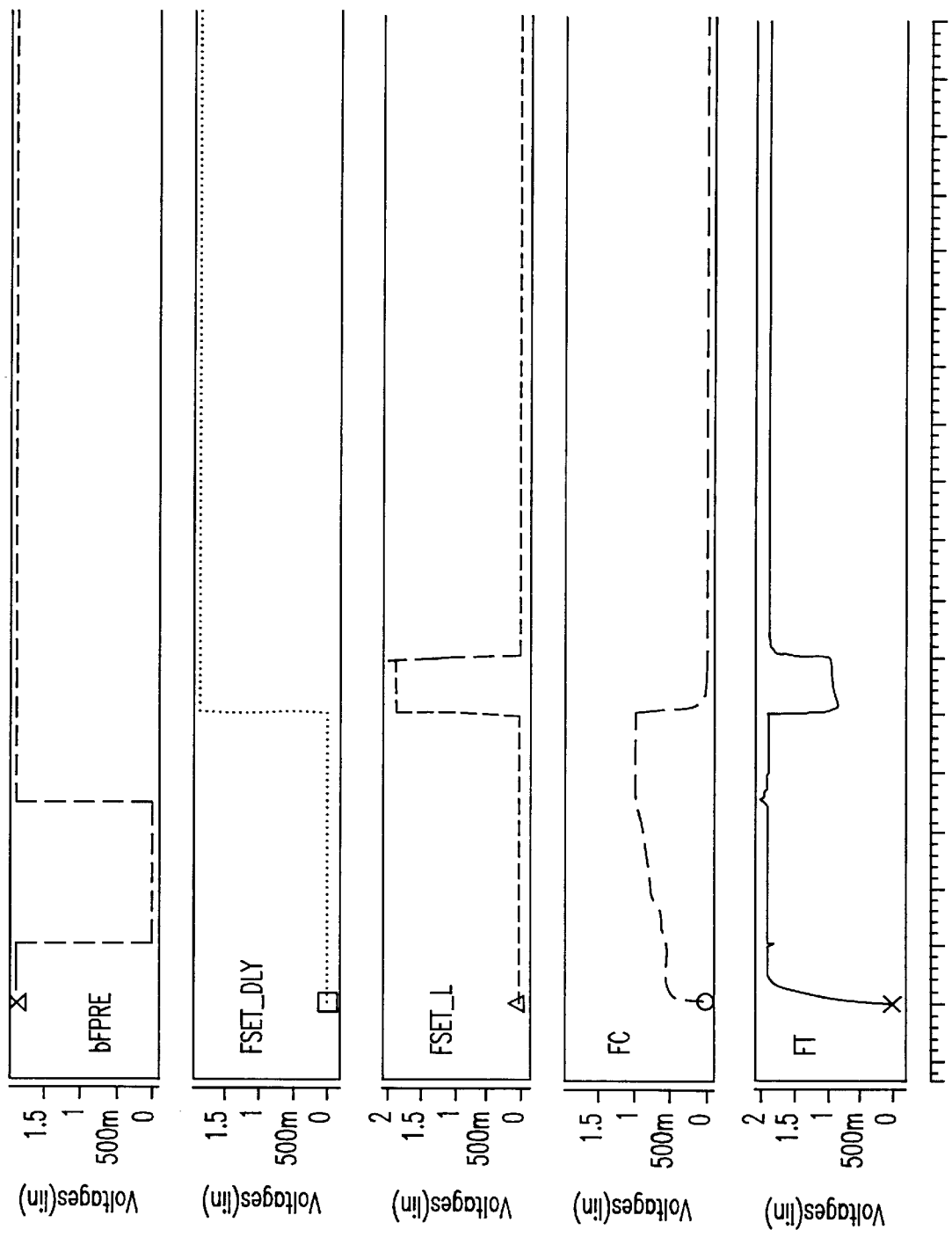
FIG. 5 is a timing diagram illustrating the operation of the circuit shown in FIG. 4.

FIG. 5 shows the timing diagram of the latch with conventional fuse. With a conventional fuse, the unblown state is a short and usually has a low resistance. When the fuse is blown, the 'open' fuse resistance can be marginal (e.g., still relatively low resistance). When bFPRE signal pulses low, node FT precharges to VDD and node FC precharge to VTRIP (VTRIP is set to a voltage less than Vdd−Vt, but greater than Vt+200 mv). At time 10 ns, FSET_L and FSETdly go high simultaneously (0 ns delay time), if the fuse is not blown, its low resistance causes FT to rapidly discharge to ground and consequently turns on device P2 and turns off device N2, allowing node FC to charge rapidly toward Vdd. If the fuse is blown, node FT begin to discharge to ground, but will be clamped at Vdd−Vt by device P1 which is gated by node FC. At the same time that node FT is discharging to Vdd−Vt, node FC also discharges through device N2 to ground. Since node FT remains at Vdd−Vt, which is greater than an nfet Vt, device N2 remains turned on hard, facilitating the full discharge of node FC to ground. White FSET_L is still high, nodes FT and FC hold their states at Vdd−Vt and ground respectively. When FSET_L goes low, node FT recovers to VDD through device P1. This completes the fuse latch indicating a set for conventional blown fuse.

In order to increase the high resistance tolerance of conventional fuse latches, one approach has been to reduce the level of competing current that flows while the blown fuse discharges the fuse side of the latch to Vdd/2. This competing current is a characteristic of most conventional fuse latch implementations and the amount of this current is a limiter on the size of blown antifuse resistance that can be successfully detected. One approach to reducing the level of this current is to place an analog voltage on the gate of the FET device which supplies the competing current. Also, the conventional latch depends on a Vdd/2 trip point, which varies with power supply fluctuations. The inventive latch can be set when the voltage between FT and FC is approximately 150 mV or greater, and this differential is not impacted by power supply fluctuations. Lastly, the latch can be designed with minimum device sizes (less area).

With the invention, there is no trip point requirement. In conventional implementations, a latch trip point (approximately Vdd/2) must be achieved prior to fully setting the latch. This conventional requirement puts stress on the maximum programmed resistance of the antifuse. With the invention the antifuse is required to form only 150 mv of differential signal across a cross-coupled latch, which is then amplified by setting the latch with set device N3.

Also, with the invention there is no competing current prior to set. In contrast to most conventional implementations, the invention allows the antifuse to form the required differential signal (approximately 150 mv) without any competing current from the latch. After the differential signal is formed, the cross-coupled latch sets with the arrival of the set signal FSETdly, and no further current is required to flow through the programmed antifuse.

Therefore, the invention provides a circuit that latches relatively small voltage differences caused by the blown fuse. This latched information is then output as the fuse signal to correctly indicate whether the fuse has been blown, even if the fuse was not completely blown. Further, as explained above in greater detail, the invention is superior to similar conventional structures because the invention can sense low resistance programmed fuses as an open state and high resistance programmed antifuses as a short state. In addition, the inventive circuit is independent of other current sources and, therefore, is not affected by fluctuating power supplies. Further, by adjusting the delay between the two nodes, the inventive circuit has a controllable resistance detection range.

While the invention has been described in terms of preferred embodiments, those skilled in the art will recognize that the invention can be practiced with modification within the spirit and scope of the appended claims.

What is claimed is:

1. A circuit adapted to sense a status of a fuse comprising:
   an imbalanced sense amplifier latch operatively connected to said fuse, said imbalanced sense amplifier latch including a first portion and a second portion, and
   a first transistor between said fuse and said imbalanced sense amplifier latch and a second transistor between said imbalanced sense amplifier and ground,
   wherein said first portion is operatively connected to said fuse and is weaker than said second portion such that said first portion senses a different voltage level than said second portion, and
   wherein a delay between activation of said first transistor and said second transistor controls a sensing resistance threshold of said circuit; and further
   wherein a voltage difference between said first portion and said second portion indicates a conductive status of said fuse.

2. The circuit in claim 1, wherein said first portion includes first devices having first gate sizes smaller than that of second devices in said second portion.

3. The circuit in claim 1, further comprising precharge devices connected to said imbalanced sense amplifier latch.

4. The circuit in claim 1, wherein a different amount of current flows through said first portion than said second portion.

5. The circuit in claim 1, wherein said fuse has an open circuit in a blown state.

6. The circuit in claim 1, wherein said fuse has a short circuit in a blown state.

7. A circuit adapted to sense a status of a fuse comprising:
   all imbalanced sense amplifier latch operatively connected to said fuse, said imbalanced sense amplifier latch including a first portion and a second portion, and
   a first transistor between said fuse and said imbalanced sense amplifier latch and a second transistor between said imbalanced sense amplifier and ground,
   wherein a delay between activation of said first transistor and said second transistor controls a sensing resistance threshold of said circuit; and further
   wherein a voltage difference between said first portion and said second portion is latched by said imbalanced sense amplifier and indicates a conductive status of said fuse.

8. The circuit in claim 7, wherein said first portion is operatively connected to said fuse and is weaker than said second portion such that said first portion senses a lower voltage that said second portion.

9. The circuit in claim 7, wherein said first portion includes first devices having first gate sizes smaller than that of second devices in said second portion.

10. The circuit in claim 7, further comprising precharge devices connected to said imbalanced sense amplifier latch.

11. The circuit in claim 7, wherein a different amount of current flows through said first portion than said second portion.

12. A circuit adapted to sense a status of a fuse comprising:
    an imbalanced sense amplifier latch operatively connected to said fuse, said imbalanced sense amplifier latch including a first portion and a second portion, and
    a first transistor between said fuse and said imbalanced sense amplifier latch and a second transistor between said imbalanced sense amplifier and ground,
    wherein a delay between activation of said first transistor and said second transistor controls a sensing resistance threshold of said circuit; and further
    wherein a voltage difference between said first portion and said second portion indicates a conductive status of said fuse.

13. The circuit in claim 12, further comprising a voltage source operatively connected to said fuse and said imbalanced sense amplifier.

14. The circuit in claim 12, wherein said first portion is operatively connected to said fuse and is weaker than said second portion such that said first portion senses a lower voltage that said second portion.

15. The circuit in claim 12, wherein said first portion includes first devices having first gate sizes smaller than that of second devices in said second portion.

16. The circuit in claim 12, further comprising precharge devices connected to said imbalanced sense amplifier latch.

17. The circuit in claim 12, wherein a different amount of current flows through said first portion than said second portion.

* * * * *